(12) United States Patent
Chang

(10) Patent No.: US 11,222,886 B2
(45) Date of Patent: Jan. 11, 2022

(54) ESD PROTECTION DEVICE WITH LOW TRIGGER VOLTAGE

(71) Applicant: Wen-Tsung Chang, Hsinchu (TW)

(72) Inventor: Wen-Tsung Chang, Hsinchu (TW)

( * ) Notice: Subject to any disclaimer, the term of this patent is extended or adjusted under 35 U.S.C. 154(b) by 36 days.

(21) Appl. No.: 16/669,475

(22) Filed: Oct. 30, 2019

(65) Prior Publication Data

US 2021/0066284 A1 Mar. 4, 2021

(30) Foreign Application Priority Data

Sep. 4, 2019 (TW) ................. 108131780

(51) Int. Cl.
*H01L 27/02* (2006.01)
(52) U.S. Cl.
CPC ................ *H01L 27/0262* (2013.01)
(58) Field of Classification Search
CPC .................................................. H01L 27/0262
See application file for complete search history.

(56) References Cited

U.S. PATENT DOCUMENTS

| | | | |
|---|---|---|---|
| 9,147,677 B2 | 9/2015 | Salcedo et al. | 257/140 |
| 9,620,495 B2 | 4/2017 | Besse et al. | H01L 27/0248 |
| 9,825,020 B2 | 11/2017 | Besse et al. | H01L 27/0262 |
| 10,157,904 B2 | 12/2018 | Mallikarjunaswamy et al. | H01L 27/0259 |
| 10,692,851 B2 | 6/2020 | Mallikarjunaswamy et al. | H01L 27/0259 |
| 2006/0006410 A1* | 1/2006 | Lee | H01L 27/10888 257/145 |
| 2014/0339601 A1* | 11/2014 | Salcedo | H01L 29/7436 257/140 |
| 2015/0221629 A1 | 8/2015 | Besse et al. | H01L 27/0248 |
| 2017/0179111 A1 | 6/2017 | Besse et al. | H01L 27/0262 |
| 2018/0286852 A1 | 10/2018 | Mallikarjunaswamy et al. | H01L 27/0259 |
| 2019/0074274 A1 | 3/2019 | Mallikarjunaswamy et al. | H01L 27/0259 |

FOREIGN PATENT DOCUMENTS

| | | | | |
|---|---|---|---|---|
| EP | 2 806 462 B1 | 2/2019 | | H01L 29/87 |
| TW | 201322423 A | 6/2013 | | H01L 27/04 |
| TW | 201838140 A | 10/2018 | | H01L 23/60 |

OTHER PUBLICATIONS

TW Application No. 108131780, Search Report, dated Jul. 24, 2020.

* cited by examiner

*Primary Examiner* — Wasiul Haider
(74) *Attorney, Agent, or Firm* — Penilla IP, APC

(57) ABSTRACT

The present invention provides an ESD protection device with the mechanism of punch through to achieve low trigger voltage. At the same time, the structure of ESD protection device includes parasitic NPN and parasitic PNP. Parasitic NPN and parasitic PNP will form a silicon controlled rectifier (SCR) device with snapback behavior to increase the protection capability of ESD protection device.

5 Claims, 5 Drawing Sheets

ESD PROTECTION DEVICE WITH LOW TRIGGER VOLTAGE

CROSS-REFERENCE TO RELATED APPLICATIONS

The present application is related to and claims priority to Taiwan Patent Application No. 108131780 filed on Sep. 4, 2019, which is hereby incorporated by reference in its entirety.

BACKGROUND OF THE INVENTION

Technical Field

The present invention relates to electrostatic discharge (ESD) protection devices, structures thereof, and methods of forming the semiconductor devices.

Description of the Prior Art

Electrostatic discharge (ESD) protection devices are required at the inputs and outputs of a circuit. The electrostatic discharge protection devices have good capability to drain a current to ground, thereby protecting the circuit from the damage of electrostatic discharge, lightning strikes, surges, or the like. Conventionally, different methods and structures have been utilized to form the ESD protection devices in the semiconductor industry.

One common ESD protection technology uses a Zener diode as a main device, as shown in FIG. 1A, with a trigger voltage higher than 5V, a high dynamic resistance, no snapback characteristic, and elevated clamping voltage. Another ESD protection technology uses a silicon controlled rectifier (SCR) as a main device. The SCR is usually accompanied by a Zener diode as a trigger component, as shown in FIG. 1B. SCR may facilitate reducing the camping voltage due to its snapback characteristic. The working voltage of current ICs gradually reduces from 5V to 3.3V, and even to 2.5V. Because of the decrease of the received voltage, a lower trigger voltage is required to help reducing the camping voltage. When the breakdown voltage of the Zener diode is as low as 5V, the breakdown curve may be softened by the tunnel effect, thereby increasing the leakage current. Thus, another ESD protection technology may utilize a low-voltage punch-through to achieve the characteristic of low trigger voltage. Low-voltage punch-through components usually have NPN structures, wherein a four-layered structure of $N^+P^+P^-N^+$, as shown in FIG. 1C, has better electrical properties—the reverse leakage current is small and the dynamic resistance is low. The snapback characteristic of the structure is not obvious; it is in an avalanche state after the punch-through and may have a low dynamic resistance to reduce the camping voltage. The ESD protection devices are usually accompanied by low-capacitance diodes to achieve the requirements of the low capacitance. Process conditions for $N^+P^+P^-N^+$ are considerably constrained—it is difficult to fabricate low-capacitance diodes on the same wafer. Usually, multi-chip packaging is needed so that the $N^+P^+P^-N^+$ low-voltage punch-through ESD protection devices can achieve the low capacitance requirement.

A technology to solve the above problems is desirable and thus the present invention arises.

SUMMARY OF THE INVENTION

An ESD protection device of the present disclosure utilizes a punch-through structure, which activates the SCR device with a leakage current after the punch-through, so that the ESD protection device can have a low trigger voltage. The trigger voltage may be reduced to 5V or lower.

In the device structure of the present disclosure, parasitic NPN and PNP transistors form a SCR device, so that the ESD protection device can have a snapback characteristic, thereby enhancing the capability of draining the current to ground and reducing the clamping voltage. Besides, the structural restriction of the ESD protection device in the present disclosure is loosened; therefore, a low-capacitance ESD protection device can be formed on a single wafer through modifying a fabrication process for low-capacitance diodes.

The present disclosure relates to a structure of an ESD protection device. In one aspect of the invention, an ESD protection device is provided, the ESD protection device comprising: a semiconductor substrate having a first doping type; a first well having the first doping type and disposed on the semiconductor substrate, the first well including a first portion and a second portion; a second well having a second doping type and disposed on the semiconductor substrate between the first portion and the second portion of the first well; and a third well having the first doping type and formed within the second well. The ESD protection device further comprises: a first diffusion region having the first doping type and formed within the first well; a second diffusion region having the first doping type and formed within the third well; and a third diffusion region having the second doping type and formed within the third well.

In one aspect of the invention, an ESD protection device is provided, the ESD protection device comprising: a semiconductor substrate having a second doping type; a first well having a first doping type and disposed on the semiconductor substrate; a second well having the second doping type and formed within the first well; and a third well having the first doping type and formed within the second well. The ESD protection device further comprises: a first diffusion region having the first doping type and formed within the first well; a second diffusion region having the first doping type and formed within the third well; and a third diffusion region having the second doping type and formed within the third well.

In some aspects, the first diffusion region is coupled to a cathode having a low electric potential, and the second diffusion region and the third diffusion region are coupled to an anode having a high electric potential.

In another aspect, an ESD protection device comprises: a semiconductor substrate with a first doping type, wherein the semiconductor substrate is heavily doped; a first epitaxial layer formed on the semiconductor substrate; a second epitaxial layer formed on the first epitaxial layer; a first buried layer having the first doping type and formed within the first epitaxial layer, the first buried layer including a first portion and a second portion; and a second buried layer having a second doping type and formed within the first epitaxial layer between the first portion and the second portion of the first buried layer. The ESD protection device further comprises: a first well having the first doping type and formed within the second epitaxial layer and above the first buried layer, the first well including a first portion and a second portion, which locate above the first portion and the second portion of the first buried layer respectively, wherein the first buried layer, the first well and the semiconductor substrate are electrically coupled; a second well having the second doping type, formed within the second epitaxial layer, and located above the second buried layer between the first portion and the second portion of the first well; and a third well having the first doping type and formed within the second well. The ESD protection device also comprises: a second diffusion region having the first doping type and formed within the third well; and a third diffusion region having the second doping type and formed within the third well.

In one aspect, an ESD protection device comprises: a semiconductor substrate with a first doping type or a second doping type, wherein the semiconductor substrate is heavily doped; a first epitaxial layer formed on the semiconductor substrate; a second epitaxial layer formed on the first epitaxial layer; a first buried layer having the first doping type and formed within the first epitaxial layer; and a second buried layer having the second doping type and formed within the first epitaxial layer at a center region of the first buried layer. The ESD protection device further comprises: a first well having the first doping type and formed within the second epitaxial layer and above the first buried layer, the first well including a first portion and a second portion, wherein the first buried layer, the first well, and the semiconductor substrate with the first doping type are electrically coupled; a second well having the second doping type and formed within the second epitaxial layer and located above the second buried layer between the first portion and the second portion of the first well; and a third well having the first doping type and formed within the second well. The ESD protection device also comprises: a second diffusion region having the first doping type and formed within the third well; and a third diffusion region having the second doping type and formed within the third well.

In some aspects, the semiconductor substrate with the first doping type is coupled to a cathode having a low electric potential, and the second diffusion region and the third diffusion region are coupled to an anode having a high electric potential.

In some other aspects, an ESD protection device comprises a semiconductor substrate with a first doping type or a second doping type, wherein the semiconductor substrate is lightly doped; a first buried layer having the first doping type and formed within the semiconductor substrate; a first epitaxial layer formed on the semiconductor substrate and the first buried layer; a second epitaxial layer formed on the first epitaxial layer; a first well having the first doping type and formed within the second epitaxial layer above the first buried layer, the first well including a first portion and a second portion; a second buried layer having the second doping type and formed within the first epitaxial layer above a center region of the first buried layer between the first portion and the second portion of the first well; a second well having the second doping type and formed within the second epitaxial layer and located above the second buried layer between the first portion and the second portion of the first well; and a third well having the first doping type and formed within the second well. The ESD protection device further comprises: a second diffusion region having the first doping type and formed within the third well; and a third diffusion region having the second doping type and formed within the third well.

In one aspect, an ESD protection device comprises: a semiconductor substrate with a first doping type or a second doping type, wherein the semiconductor substrate is lightly doped; a first buried layer having the first doping type and formed within the semiconductor substrate; a first epitaxial layer formed on the semiconductor substrate and the first buried layer; a first well having the first doping type and formed within the first epitaxial layer above the first buried layer, the first well including a first portion and a second portion; a second buried layer having the second doping type and formed within the semiconductor substrate and located above a center region of the first buried layer between the first portion and the second portion of the first well; a second well having the second doping type and formed within the first epitaxial layer and located above the second buried layer between the first portion and the second portion of the first well; and a third well having the first doping type and formed within the second well. The ESD protection device further comprises: a second diffusion region having the first doping type and formed within the third well; and a third diffusion region having the second doping type and formed within the third well.

In some aspects, the second diffusion region and the third diffusion region are coupled to the same endpoint.

In some aspects, the third diffusion region, the third well and the second well form a PNP transistor; and the third well, the second well and the first well form a NPN transistor.

In some aspects, the second well is a floating region.

In some aspects, an ESD protection device further comprises a first diffusion region having the first doping type and formed within the first well.

In some aspects, the first diffusion region is coupled to a cathode at a low electric potential; and the second diffusion region and the third diffusion region are coupled to an anode at a high electric potential.

BRIEF DESCRIPTION OF THE DRAWINGS

A more thorough understanding of the disclosure may be acquired by referring to the description and accompanying drawings, wherein.

DETAILED DESCRIPTION OF THE PREFERRED EMBODIMENTS

Figure 1A:
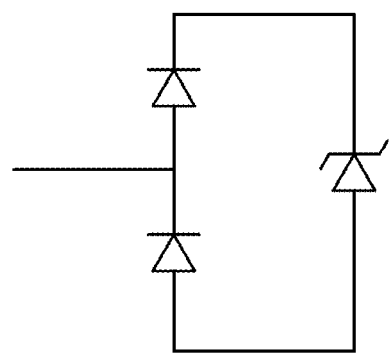
FIG. 1A is a prior art: an ESD protection technology utilizing a Zener diode as a main device.
Figure 1B:
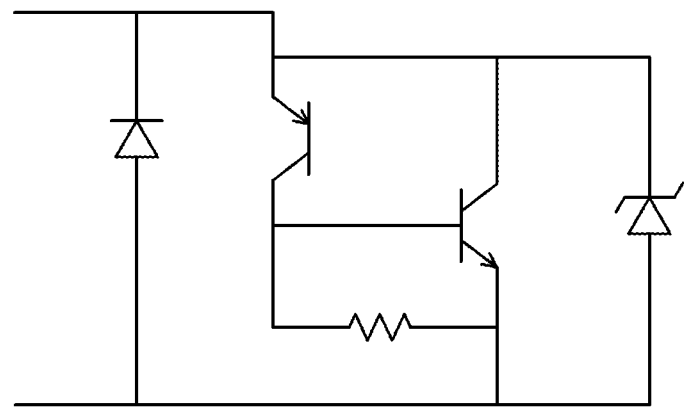
FIG. 1B is a prior art: an ESD protection technology utilizing a silicon controlled rectifier (SCR) as a main device.
Figure 1C:
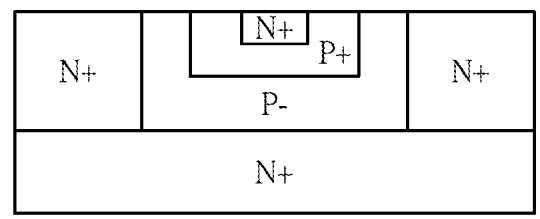
FIG. 1C is a prior art: NPN low punch-through voltage technology.

The objects, advantages and features of the present invention will become apparent from the following detailed descriptions of the embodiments in conjunction with the accompanying drawings.

In the following description, numerous specific details are set forth to provide a thorough understanding of the presented embodiments. However, the disclosed embodiments may be implemented without some or all of these specific details. In other instances, conventional structures and operations have not been described in detail to not unnecessarily obscure the disclosed embodiments. It should be understood that the various embodiments shown in the drawings are schematic, and are not necessarily drawn to scale.

Figure 2:
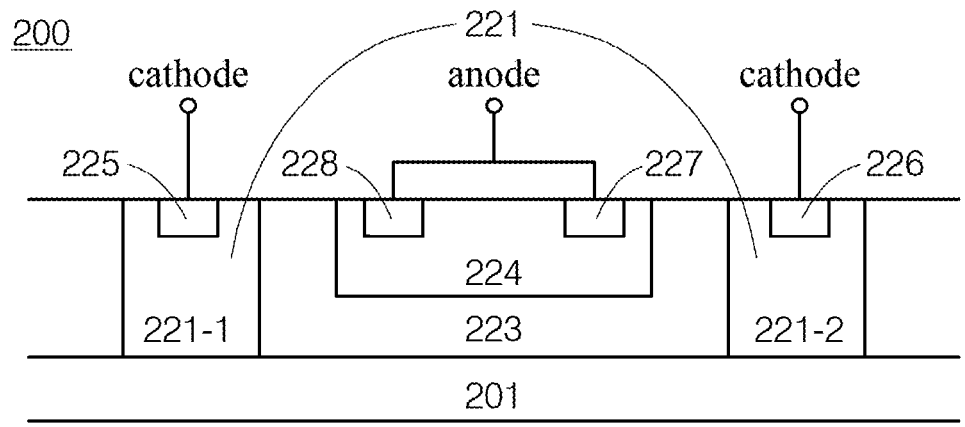
FIG. 2 is a cross-sectional diagram of an ESD protection device with an N type substrate according to one embodiment of the present invention.

FIG. 2 is a cross-sectional diagram of a semiconductor structure of an ESD protection device 200 according to one embodiment of the present invention. As shown in FIG. 2, the ESD protection device 200 includes an N-type substrate 201. A P-well 223 and a deep N-well 221 are formed on the N-type substrate 201, wherein the deep N-well 221 includes a first portion 221-1 and a second portion 221-2. The P-well 223 is located between the first portion 221-1 and the second portion 221-2 of the deep N-well 221. In such an embodiment, there are an N-type diffusion region 225 and an N-type diffusion region 226 formed within the first portion 221-1 and the second portion 221-2 of the deep N-well 221 respectively. An N-well 224 is formed within the P-well 223. An N-type diffusion region 227 and a P-type diffusion region 228 are formed within the N-well 224.

Figure 3:
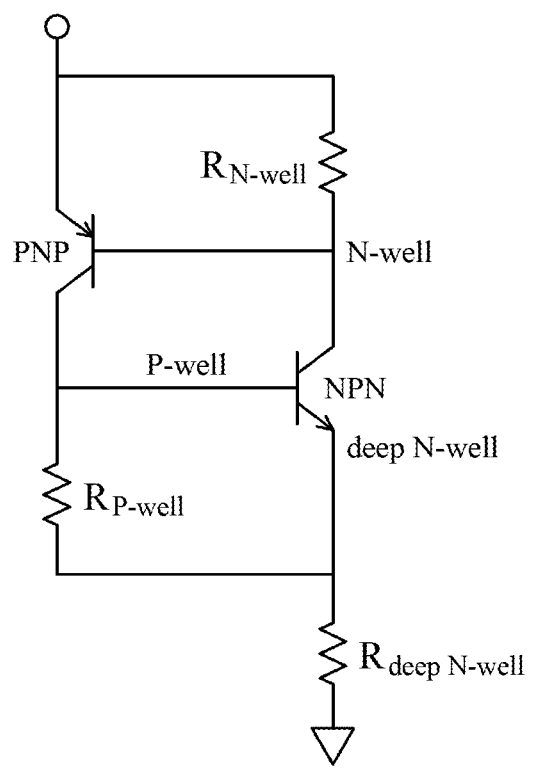
FIG. 3 is a diagram showing an equivalent circuit of one embodiment of the present invention.

The P-type diffusion region 228, the N-well 224, and the P-well 223 form a PNP transistor. The N-well 224, the P-well 223, and the deep N-well 221 and the N-type substrate 201 form a NPN transistor. These two parasitic PNP transistor and NPN transistor form a SCR device, as shown in the circuit diagram of FIG. 3. As shown in FIG. 3, the $R_{P\text{-}well}$ and $R_{N\text{-}well}$ represent the parasitic resistance of the P-well 223 and the N-well 224 respectively, while the $R_{deep\ N\text{-}well}$ represents the parasitic resistance of the deep N-well 221 and the N-type substrate 201. In this circuit, the emitter and the base of the PNP transistor are electrically coupled to the same endpoint.

In this circuit, the junction of the N-well and the P-well is reversely biased when a forward bias voltage is applied to the N-type diffusion region and the P-type diffusion region within the N-well simultaneously. A punch-through will occur between the P-type diffusion region and the P-well when a certain bias voltage is achieved. Then, a leakage current increases as the applied forward bias voltage increases. When the leakage current is sufficient to activate the SCR device, the applied forward bias voltage is so-called trigger voltage. A snapback phenomenon occurs after the SCR device is activated.

Specifically, the junction between the N-well 224 and the P-well 223 is reversely biased when a forward bias voltage is applied to the N-type diffusion region 227 and the P-type diffusion region 228 simultaneously. The depletion region expands as the applied bias voltage increases. The punch-through status will be achieved when the depletion region contacts the P-type diffusion region 228.

The reverse leakage current is small before punch-through, and the leakage current does not significantly increase as the applied bias voltage increases. A significant leakage current is generated after punch-through and the electron holes in the leakage current are injected into the P-well 223 from the N-well 224. The P-well 223 is the base of the NPN transistor. The holes entering the P-well 223 are the majority carriers, which forms a base current. The base current urges the emitter to inject the electrons to the base, that is, the electrons will be injected to the P-well 223 from regions such as the deep N-well 221 and the N-type substrate, etc. These injected electrons are collected by the collector, the N-well 224, after passing through the P-well 223 since the junction of the N-well 224 and the P-well 223 is reversely biased. In the meantime, the electrons entering the N-well 224 are the majority carriers and will become the base current of the PNP transistor. This base current may urge the emitter to inject the electron holes to the base, that is, the electron holes will be injected to the N-well 224 from the P-type diffusion region 228. The injected electron holes are collected by the collector, the P-well 223, after passing through the N-well 224 since the junction of the N-well 224 and the P-well 223 is reversely biased. An internal positive feedback mechanism is therefore formed so that the current markedly increases as the applied bias voltage increases after the punch-through. After the NPN and the PNP transistors are concurrently activated, the positive feedback mechanism allows the SCR to form a self-sustained conduction path, which makes the via resistance decrease rapidly, thereby the snapback phenomenon occurs. The activation mechanism generally used in the SCR device of ESD protection utilizes the parasitic resistance to generate a voltage drop of about 0.7V, so that the base and the emitter may achieve a sufficient forward bias to activate the NPN or the PNP transistor. In the present invention, the PNP transistor conducts in a punch-through mode, and the punch-through leakage current is directly used as a base current to activate the NPN transistor so as to reduce the trigger voltage for activating the SCR device.

In one embodiment, the P-well 223 remains floating, and thus there's an NPN transistor with the base open-circuited. All electron holes must flow toward the emitter when the holes are injected to the P-well 223 from the N-well 224, which may effectively induce the electrons of the emitter of the NPN transistor to be injected to the base. The initiating current required for activating the SCR device is thus decreased, and thereby the trigger voltage is reduced. If the P-well 223 is coupled to a cathode, the electron holes in the leakage current after the punch-through will be exported from the P-well 223, and thus the injection of the electrons of the emitter to the base in the NPN transistor cannot be induced effectively. That is, when the base and the emitter of the NPN transistor are shorted, a larger punch-through leakage current is required for the parasitic resistance $R_{P\text{-}well}$ to generate a voltage drop of about 0.7V, so that the NPN transistor cannot be activated until the emitter and the base achieve a sufficient forward bias. Therefore, the P-well 223 should be effectively isolated from other P-type regions by N-type regions or trench isolation structures.

In the embodiment mentioned above, within the N-well 224 there has to be at least one N-type diffusion region such as N-type diffusion region 227 and at least one P-type diffusion region such as P-type diffusion region 228. In the present invention, optionally, there may be a plurality of N-type diffusion regions or P-type diffusion regions according to requirements. In one embodiment, all the N-type diffusion regions and the P-type diffusion regions within the N-well 224 have to be coupled to the same endpoint. In one embodiment, the deep N-well 221 may be a part of the N-type substrate 201, that is, the deep N-well 221 and the N-type substrate 201 may be combined into one. It is noted that the N-type diffusion regions and the P-type diffusion regions within the N-well 224 can be coupled to the same endpoint inside or outside the device in any manner which is well-known by those skilled in the art, as long as the circuit shown in FIG. 3 is achieved.

In FIG. 2, the N-type diffusion regions 225, 226 are shown within the first portion 221-1 and the second portion 221-2 of the deep N-well 221 respectively; however, the invention is not so limited. There may be one or more N-type diffusion regions within the deep N-well 221, as long as the circuit function shown in FIG. 3 can be accomplished. That is, there may only provide one of the N-type diffusion region 225 in the first portion 221-1 and the N-type diffusion region 226 in the second portion 221-2 of the deep N-well 221. In one embodiment, the deep N-well 221 may be configured as a single deep N-well surrounding the P-well 223. The deep N-well may also be a combination of multiple separate deep N-wells. As those skilled in the art understand, the configuration of the deep N-well 221 is not so limited, as long as the circuit function shown in FIG. 3 can be achieved.

Figure 4:
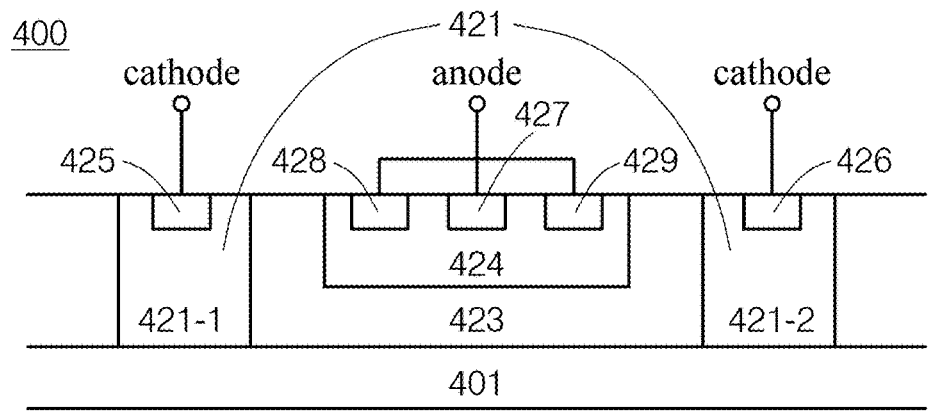
FIG. 4 is a cross-sectional diagram of an ESD protection device with an N-type substrate according to one embodiment of the present invention.

FIG. 4 is a cross-sectional diagram of a semiconductor structure of an ESD protection device 400 according to one embodiment of the present invention. The ESD protection device 400 includes an N-type substrate 401. A P-well 423 and a deep N-well 421 are formed on the N-type substrate 401, wherein the deep N-well 421 includes a first portion 421-1 and a second portion 421-2. The P-well 423 is located between the first portion 421-1 and the second portion 421-2 of the deep N-well 421. There are an N-type diffusion region 425 and an N-type diffusion region 426 formed within the first portion 421-1 and the second portion 421-2 of the deep N-well 421 respectively. An N-well 424 is formed within the P-well 423. An N-type diffusion region 427, a P-type diffusion region 428 and a P-type diffusion region 429 are formed within the N-well 424. Similarly, the P-type diffusion region 428 or 429, the N-well 424, and the P-well 423 form a PNP transistor; and the N-well 424, the P-well 423, and the deep N-well 421 and the N-type substrate 401 form a NPN transistor.

In the embodiment of FIG. 4, considering symmetry of the device structure, it is shown that a P-type diffusion region is formed on each side of the N-type diffusion region 427—the P-type diffusion region 428 and the P-type diffusion region 429 respectively. It should be understood that the present invention is not limited to the configuration of this embodiment; instead, a lot of variations are possible. In one embodiment, the deep N-well 421 may be a part of the N-type substrate 401, that is, the deep N-well 421 and the N-type substrate 401 may be combined into one. Similarly, all the N-type diffusion regions and the P-type diffusion regions within the N-well 424 have to be coupled to the same endpoint. It is noted that the N-type diffusion regions and the P-type diffusion regions within the N-well 424 may be coupled to the same endpoint inside the device, outside the device or with any other ways in any manner known by those skilled in the art, as long as the circuit function of FIG. 3 can be achieved. Similarly, the P-well 423 remains floating, and thus there forms a NPN transistor with the base open circuited. This allows the initiating current required for activating the SCR device to be reduced, and thereby the trigger voltage may be reduced. If the P-well 423 is coupled to a cathode directly, the leakage current after the punch-through will be exported from the P-well 423, which results in that the injection of the electrons of the emitter to the base in the NPN transistor may not be induced effectively. Therefore, the P-well 423 needs to be effectively isolated from other P-type regions by N-type regions or trench isolation structures.

Figure 5:
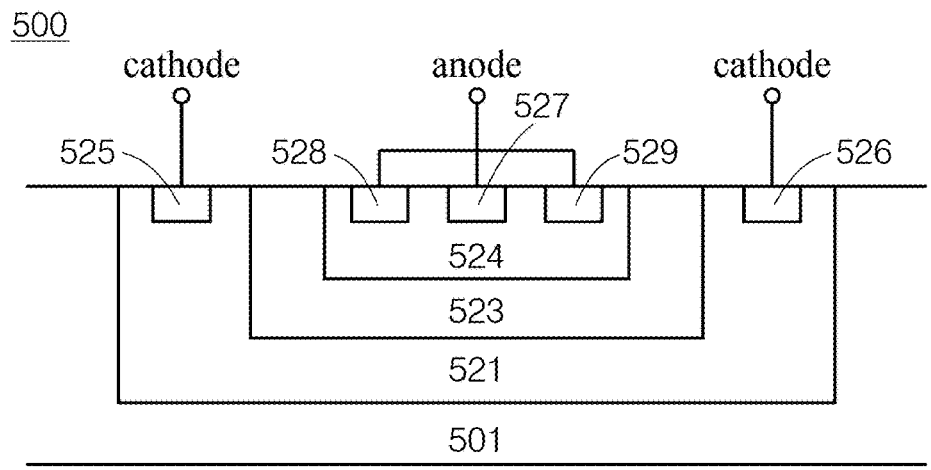
FIG. 5 is a cross-sectional diagram of an ESD protection device with a P-type substrate according to one embodiment of the present invention.

In the embodiment mentioned above, an N-type substrate is utilized. However, in additional embodiments, a P-type substrate may be utilized. FIG. 5 is a cross-sectional diagram of an ESD protection device 500 using a P-type substrate according to another embodiment of the present invention. As shown in the figure, in the ESD protection device 500, it is required to form a deep N-well 521 on a P-type substrate 501 first. A P-well 523 is formed within the deep N-well 521, so that the P-well 523 and the P-type substrate 501 are isolated from each other. An N-type diffusion region 525 and an N-type diffusion region 526 are formed within the deep N-well 521. An N-well 524 is formed within the P-well 523. An N-type diffusion region 527, a P-type diffusion region 528 and a P-type diffusion region 529 are formed within the N-well 524. The operating principle of the ESD protection device 500 is substantially the same with the ESD protection devices 200, 400 of FIG. 2, 4 above. Similarly, there have to be at least one N-type diffusion region and at least one P-type diffusion region within the N-well 524, and optionally there may be a plurality of N-type diffusion regions or P-type diffusion regions according to the requirements. Similarly, all the N-type diffusion regions and the P-type diffusion regions within the N-well 524 may be coupled to the same endpoint inside the device, outside the device or with any other ways in any manner known by those skilled in the art, as long as the circuit function aforementioned can be accomplished. There may be one or more N-type diffusion regions in the deep N-well 521, that is, there may provide only one of the N-type diffusion region 525 and N-type diffusion region 526 within the deep N-well 521.

An epitaxial layer (EPI) process is usually required in case of fabricating a vertical ESD protection device or optimizing electricity properties. In the embodiments utilizing the epitaxial layer, the processes will be more flexible and there are different options depending on the requirements of applications or processes. According to the application requirements, the substrates used may be N-type or P-type, and also may be lightly doped or heavily doped. According to the process requirements, the epitaxial layers may be N-type or P-type, and a single epitaxial layer or double epitaxial layers may be used. Similarly, according to the process requirements, an N-type buried layer and a P-type buried layer may be selectively used or not. A buried layer may be formed on a substrate or a first epitaxial layer. Several embodiments are described below as examples.

Figure 6:
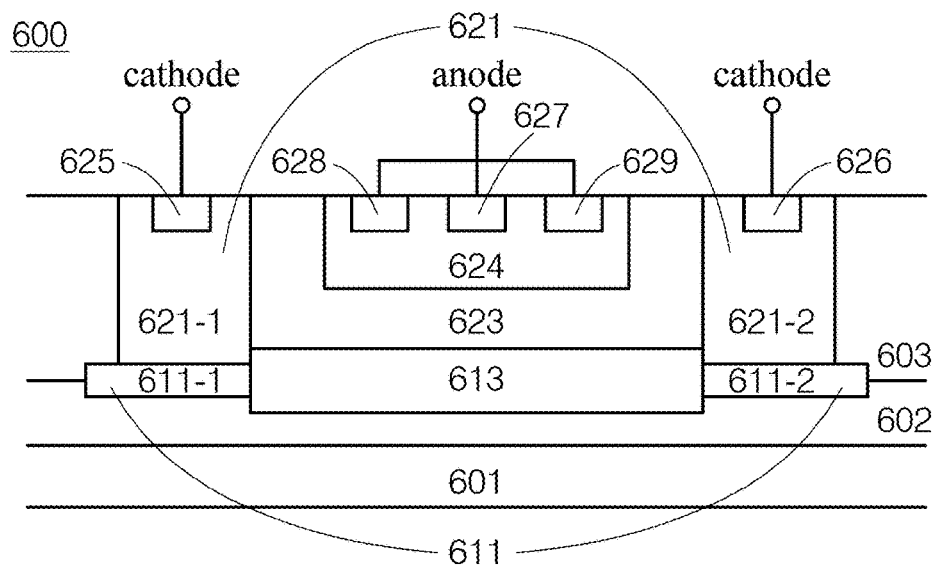
FIG. 6 is a cross-sectional diagram showing one embodiment of the present invention, in which double epitaxial layers and a heavily doped N-type substrate are utilized.

FIG. 6 is a cross-sectional diagram showing an ESD protection device 600 of one embodiment according to the present invention. In this embodiment, an double epitaxial layer process and a heavily doped N-type substrate are utilized. The ESD protection device 600 includes a heavily doped N-type substrate 601. A first epitaxial layer 602 is formed on the substrate 601. A buried layer process is performed on the first epitaxial layer 602 to form an N-type buried layer 611 and a P-type buried layer 613, wherein the N-type buried layer 611 includes a first portion 611-1 and a second portion 611-2. The P-type buried layer 613 is located between the first portion 611-1 and the second portion 611-2 of the N-type buried layer 611. Then, a second epitaxial layer 603 is formed. In the second epitaxial layer 603, a P-well 623 is formed on and connected to the P-type buried layer 613. A deep N-well 621 is formed on and connected to the N-type buried layer 611, wherein the deep N-well 621 includes a first portion 621-1 and a second portion 621-2, and the P-well 623 is located between the first portion 621-1 and the second portion 621-2 of the deep N-well 621. The deep N-well 621, the N-type buried layer 611, and the heavily doped N-type substrate are electrically coupled and thereby conducted to one another. The N-type buried layer 611 and the heavily doped N-type substrate can be coupled to each other by using an N-type epitaxial layer as the first epitaxial layer 602. Alternatively, the N-type buried layer 611 and the heavily doped N-type substrate may be connected, and thus conducted, to each other in the first epitaxial layer 602 via diffusion of a subsequent thermal process. There are an N-type diffusion region 625 and an N-type diffusion region 626 formed within the first portion 621-1 and the second portion 621-2 of the deep N-well 621 respectively. An N-well 624 is formed within the P-well 623. An N-type diffusion region 627, a P-type diffusion region 628 and a P-type diffusion region 629 are formed within the N-well 624. One N-type diffusion region 627 and two P-type diffusion regions 628, 629 are shown herein; however, the present invention is not so limited. One or more N-type diffusion regions and one or more P-type diffusion regions may be configured within the N-well 624, as long as the circuit function aforementioned may be achieved. Likewise, the operation concept of the device structure on the structures of the epitaxial layers and the buried layers is the same as the ESD protection device 400 illustrated in FIG. 4. Similarly, the P-type diffusion region 628 or 629, the N-well 624, and the P-well 623 and the P-type buried layer 613 form a PNP transistor; and the N-well 624, the P-well 623 and the P-type buried layer 613, and the deep N-well 621 and the N-type buried layer 611 form a NPN transistor. It should be noted that a terminal of the cathode may be relocated to the bottom of the heavily doped substrate from the wafer surface in case of fabricating a vertical ESD protection device. In this case, the N-type diffusion region 625 and the N-type diffusion region 626 may be omitted.

Figure 7:
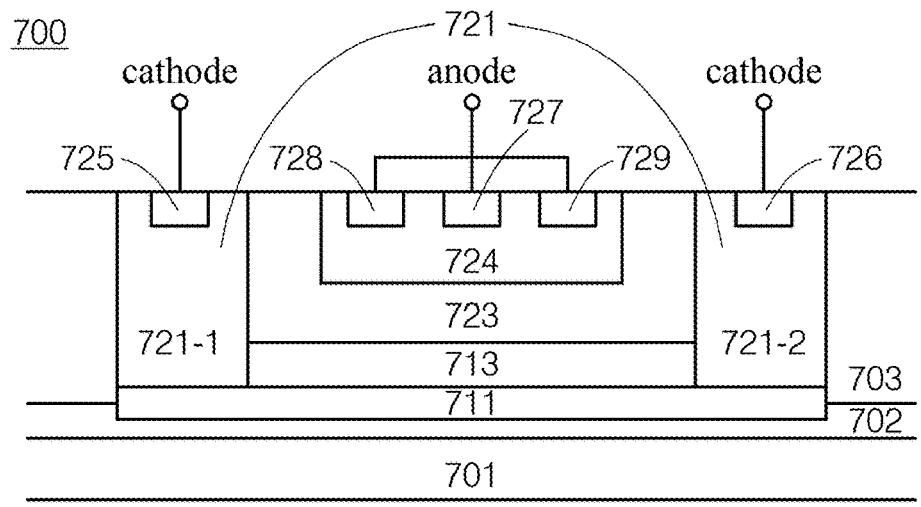
FIG. 7 is a cross-sectional diagram showing one embodiment of the present invention, in which double epitaxial layers and a heavily doped N-type or P-type substrate are utilized.

FIG. 7 is a cross-sectional diagram showing an ESD protection device 700 according to another embodiment of the present invention, in which a double epitaxial layer process and a heavily doped N-type substrate are utilized. The ESD protection device 700 includes a heavily doped N-type substrate 701. A first epitaxial layer 702 is formed on the substrate 701. A buried layer process is performed on the first epitaxial layer 702 to form an N-type buried layer 711. A P-type buried layer 713 is formed in the center region above the N-type buried layer 711. Then, a second epitaxial layer 703 is formed. In the second epitaxial layer 703, a P-well 723 is formed on and connected to the P-type buried layer 713. A deep N-well 721 is formed on the N-type buried layer 711 at two sides of the P-well 723 and the P-type buried layer 713. The deep N-well 721 is connected to the N-type buried layer 711, wherein the deep N-well 721 includes a first portion 721-1 and a second portion 721-2, and the P-well 723 and the P-type buried layer 713 is located between the first portion 721-1 and the second portion 721-2 of the deep N-well 721. The deep N-well 721, the N-type buried layer 711, and the heavily doped N-type substrate are electrically coupled and thereby being conducted to one another. The N-type buried layer 711 and the heavily doped N-type substrate can be coupled to each other by using an N-type epitaxial layer as the first epitaxial layer 702. Alternatively, the N-type buried layer 711 and the heavily doped N-type substrate may be connected, and thus conducted, to each other in the first epitaxial layer 702 via diffusion of a subsequent thermal process. There are an N-type diffusion region 725 and an N-type diffusion region 726 formed within the first portion 721-1 and the second portion 721-2 of the deep N-well 721 respectively. An N-well 724 is formed within the P-well 723. An N-type diffusion region 727, a P-type diffusion region 728 and a P-type diffusion region 729 are provided within the N-well 724. Likewise, the operation concept of the device structure on the structures of the epitaxial layers and the buried layers is the same as that of the ESD protection device 400 illustrated in FIG. 4. Similarly, the P-type diffusion region 728 or 729, the N-well 724, and the P-well 723 and the P-type buried layer 713 form a PNP transistor, while the N-well 724, the P-well 723 and the P-type buried layer 713, and the deep N-well 721 and the N-type buried layer 711 form a NPN transistor. As mentioned above, the terminal of the cathode can be relocated from a chip surface to the bottom of the heavily doped substrate in case of fabricating a vertical ESD protection device, and the N-type diffusion region 725 and the N-type diffusion region 726 may thus be omitted. In another embodiment, the heavily dope N-type substrate may be replaced by a heavily dope P-type substrate. In this scenario, the N-type buried layer 711 doesn't need to be electrically coupled with the heavily dope P-type substrate.

Figure 8:
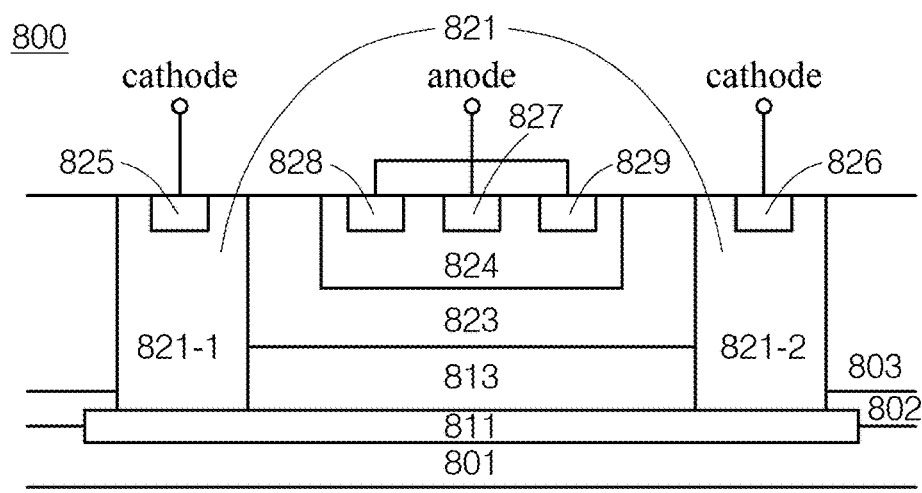
FIG. 8 is a cross-sectional diagram showing one embodiment of the present invention, in which double epitaxial layers and a lightly doped N-type or P-type substrate are utilized.

FIG. 8 is a cross-sectional diagram showing an ESD protection device 800 according to one embodiment of the present invention, in which double epitaxial layers and a lightly doped N-type substrate are utilized. The ESD protection device 800 includes a lightly doped N-type substrate 801. An N-type buried layer 811 is formed on the substrate 801. A first epitaxial layer 802 is formed on the substrate 801 having an N-type buried layer 811 formed thereon. A P-type buried layer 813 is formed within the epitaxial layer at the center region above the N-type buried layer 811, and then a second epitaxial layer 803 is formed thereon. In the second epitaxial layer 803, a P-well 823 is formed on and connected to the P-type buried layer 813. A deep N-well 821 is formed on the N-type buried layer 811 at two sides of the P-well 823 and the P-type buried layer 813. The deep N-well 821 is connected to the N-type buried layer 811, wherein the deep N-well 821 includes a first portion 821-1 and a second portion 821-2. The P-well 823 and the P-type buried layer 813 are located between the first portion 821-1 and the second portion 821-2 of the deep N-well 821. There are an N-type diffusion region 825 and an N-type diffusion region 826 formed within the first portion 821-1 and the second portion 821-2 of the deep N-well 821 respectively. An N-well 824 is formed within the P-well 823. An N-type diffusion region 827, a P-type diffusion region 828 and a P-type diffusion region 829 are formed within the N-well 824. In another embodiment, the lightly dope N-type substrate may be replaced by a lightly dope P-type substrate. Likewise, the operation concept of the device structure on the structures of the epitaxial layers and the buried layers is the same as that of the ESD protection device 400 illustrated in FIG. 4. Similarly, the P-type diffusion region 828 or 829, the N-well 824, and the P-well 823 and the P-type buried layer 813 form a PNP transistor, while the N-well 824, the P-well 823 and the P-type buried layer 813, and the deep N-well 821 and the N-type buried layer 811 form a NPN transistor.

Figure 9:
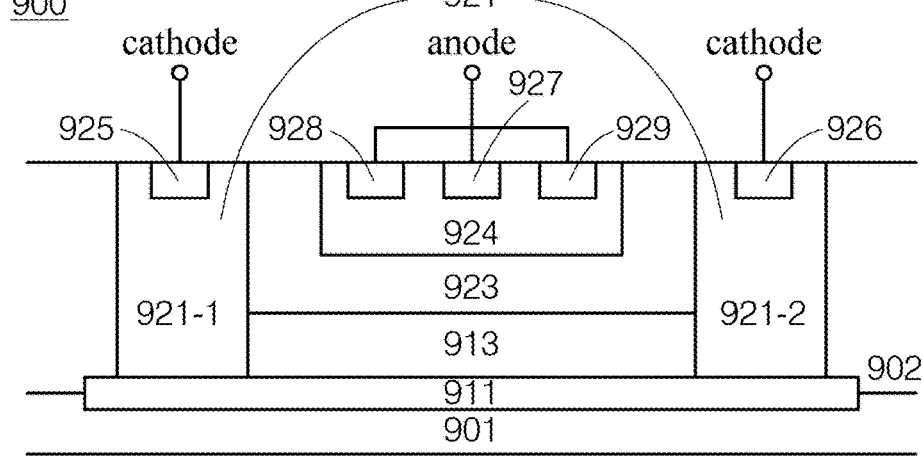
FIG. 9 is a cross-sectional diagram showing one embodiment of the present invention, in which a single epitaxial layer and a lightly doped N-type or P-type substrate are utilized.

As mentioned, depending on the process requirements, the epitaxial layers may be single-layered or double-layered. FIG. 9 is a cross-sectional diagram showing an ESD protection device 900 according to one embodiment of the present invention, in which a single epitaxial layer and a lightly doped P-type substrate are utilized. The ESD protection device 900 includes a lightly doped N-type substrate 901. An N-type buried layer 911 is formed on the substrate 901. A P-type buried layer 913 is formed at the center region above the N-type buried layer 911, and then an epitaxial layer 902 is formed thereon. In the epitaxial layer 902, a P-well 923 is formed on and connected to the P-type buried layer 913. A deep N-well 921 is formed on the N-type buried layer 911 at two sides of the P-well 923 and the P-type buried layer 913. The deep N-well 921 is connected to the N-type buried layer 911, wherein the deep N-well 921 includes a first portion 921-1 and a second portion 921-2. The P-well 923 is located between the first portion 921-1 and the second portion 921-2 of the deep N-well 921. There are an N-type diffusion region 925 and an N-type diffusion region 926 formed within the first portion 921-1 and the second portion 921-2 of the deep N-well 921 respectively. An N-well 924 is formed at a center region within the P-well 923. An N-type diffusion region 927, a P-type diffusion region 928 and a P-type diffusion region 929 are formed within the N-well 924. In another embodiment, the lightly dope P-type substrate may be replaced by a lightly dope N-type substrate. The operation concept of the device structure on the structures of the epitaxial layer and the buried layers is the same as that of the ESD protection device 400 illustrated in FIG. 4. Similarly, the P-type diffusion region 928 or 929, the N-well 924, and the P-well 923 and the P-type buried layer 913 form a PNP transistor, while the N-well 924, the P-well 923 and the P-type buried layer 913, and the deep N-well 921 and the N-type buried layer 911 form a NPN transistor.

Figure 10:
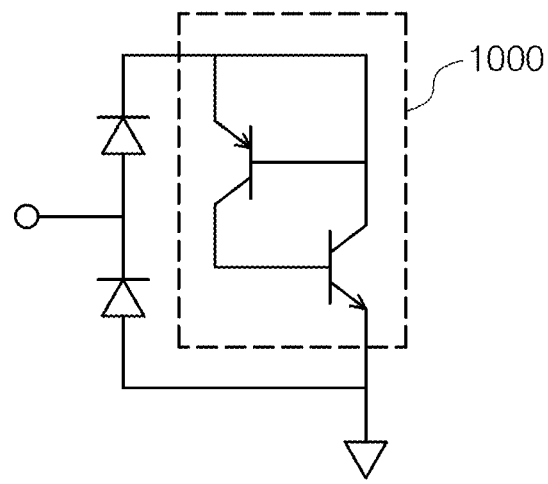
FIG. 10 is a diagram showing a low-capacitance ESD protection circuit composed of a diode and an ESD protection device of the present invention.

In the embodiments with the epitaxial layer of the present invention, an N-type or a P-type epitaxial layer may be selected depending on the requirements. In the embodiments with the epitaxial layer of FIG. 6 to FIG. 9, the P-type buried layer is formed below the floating P-well. There is an N-type buried layer or a heavily doped N-type substrate below the P-type buried layer. In such structure, the holding current can be increased through adjustment of process parameters. A more highly doped P-type buried layer and N-type buried layer or an N-type substrate can be utilized to adjust current gain of the NPN transistor, so that the proportion of electrons in a current passing through the P-well and the P-type buried layer may be close to the proportion of holes. When a snapback occurs, the conductivity modulation may effectively reduce the resistance of the P-well and the P-type buried layer so as to increase the holding current. FIG. 10 is a diagram showing a low-capacitance ESD protection circuit composed of a diode and an ESD protection device of the present invention. To achieve the requirements of low capacitance, a low-capacitance diode is needed. As the combination circuit shown in FIG. 10, the N-type terminal of the upper diode is coupled to the anode of the ESD protection device 1000 through a metal wire. The diode and the anode of the ESD protection device 1000 may be separated by trench isolation structures to reduce parasitic capacitance and avoid other parasitic effects.

Figure 11:
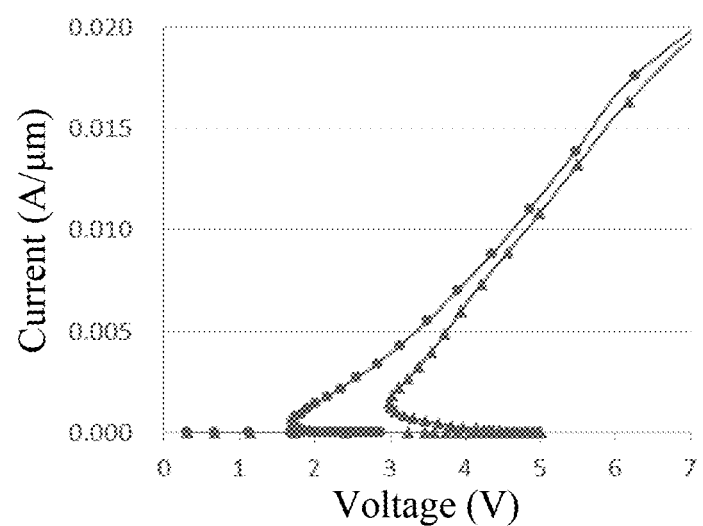
FIG. 11 is a diagram showing the simulated I-V characteristic of the embodiment employing epitaxial layers during the operation.

In present invention, a leakage current after a punch-through state is utilized to activate the SCR device, so that the ESD protection device has a low trigger voltage. The trigger voltage may be reduced to 5V or lower. In the embodiments optimizing structures and processes, the holding voltage or the holding current may be raised to avoid the latching issue of the SCR device. FIG. 11 illustrates the simulation I-V characteristic of the embodiment with epitaxial layers of the present invention during the operation, wherein the circular data points indicate I-V data points with 3V trigger voltage, which represent the I-V characteristic with 3V trigger voltage; the triangular data points are I-V data points with 5V trigger voltage, which represent the I-V characteristic with 5V trigger voltage.

The process for the ESD protection device of the present invention is flexible. The ESD protection device may be fabricated as a vertical or lateral device depending on different requirements. The ESD protection device may be applied not only in system-level ESD protection, but also in ESD protection within an integrated circuit.

The foregoing descriptions are merely preferred embodiments of the present invention, and are not intended to limit the present invention. Equivalent variations and modifications based on the disclosure of the invention to gain the benefit provided herein or to achieve similar purposes of the disclosure are still in the scope of the present invention. Those skilled in the art can appreciate that the N-type and the P-type of the structures in FIG. 2 and FIG. 4-9 may be interchangeable, and the cathodes and the anodes shown in the figures may thus be interchanged. The structure after such an interchange may still have the function disclosed herein.

Although the embodiments aforementioned have been described in detail for purposes of clarity of understanding, however, apparently, certain changes and modifications may be practiced within the scope of the disclosed concepts. It is noted that there are many alternative ways to implement the structures of the present invention. Therefore, the embodiments herein are considered as illustrative and not restrictive, and the present invention is not limited to the details provided in the description herein.

What is claimed is:

1. An electrostatic discharge (ESD) protection device, comprising:
   a semiconductor substrate with a first doping type or a second doping type, wherein the semiconductor substrate is lightly doped;
   a first buried layer with the first doping type, formed within the semiconductor substrate;
   a first epitaxial layer formed on the semiconductor substrate and the first buried layer;
   a first well with the first doping type, formed within the first epitaxial layer immediately above the first buried layer, the first well including a first portion and a second portion;
   a second buried layer with the second doping type, located above the first buried layer at a center region of the first buried layer between the first portion and the second portion of the first well;
   a second well with the second doping type, formed within the first epitaxial layer, the second well located immediately above the second buried layer between the first portion and the second portion of the first well;
   a third well with the first doping type, formed within the second well;
   a second diffusion region with the first doping type, formed within the third well; and
   a third diffusion region with the second doping type, formed within the third well,
   wherein the first well is adjacent to the second well, and
   wherein the third diffusion region, the third well, and the second well and the second buried layer form a PNP transistor, and wherein the third well, the second well and the second buried layer, and the first well form an NPN transistor.

2. The electrostatic discharge (ESD) protection device of claim 1, wherein the second diffusion region and the third diffusion region are coupled to an anode.

3. The electrostatic discharge (ESD) protection device of claim 1, wherein the second well is a floating region.

4. The electrostatic discharge (ESD) protection device of claim 1, further comprising a first diffusion region with the first doping type formed within the first well.

5. The electrostatic discharge (ESD) protection device of claim 4, wherein the first diffusion region is coupled to a cathode; and the second diffusion region and the third diffusion region are coupled to an anode.

\* \* \* \* \*